:::
United States Patent [19]
McClure

[11] Patent Number: 5,300,828
[45] Date of Patent: Apr. 5, 1994

[54] SLEW RATE LIMITED OUTPUT BUFFER WITH BYPASS CIRCUITRY

[75] Inventor: David C. McClure, Carrollton, Tex.

[73] Assignee: SGS-Thomson Microelectronics, Inc., Carrollton, Tex.

[21] Appl. No.: 938,399

[22] Filed: Aug. 31, 1992

[51] Int. Cl.⁵ .................... H03K 17/16; H03K 6/04; H03K 19/0948
[52] U.S. Cl. .................... 307/443; 307/263; 307/473; 307/451
[58] Field of Search ............ 307/263, 443, 473, 475, 307/451

[56] References Cited

U.S. PATENT DOCUMENTS

| | | | |
|---|---|---|---|
| 4,532,439 | 7/1985 | Koike | 307/451 |
| 4,612,466 | 9/1986 | Stewart | 307/451 |
| 4,791,321 | 12/1988 | Tanaka et al. | 307/475 |
| 4,800,298 | 1/1989 | Yu et al. | 307/443 |
| 4,859,870 | 8/1989 | Wong et al. | 307/443 |
| 4,959,561 | 9/1990 | McDermott et al. | 307/263 |
| 5,111,076 | 5/1992 | Tarng | 307/451 |

OTHER PUBLICATIONS

Sedra et al.; Microelectronic Circuits; ©1987 by Holt, Rinehart and Winston, Inc.; p. 351.

Primary Examiner—Edward P. Westin
Assistant Examiner—Benjamin D. Driscoll
Attorney, Agent, or Firm—Kenneth C. Hill; Renee Michelle Larson; Richard K. Robinson

[57] ABSTRACT

An output driver stage for an integrated circuit device includes slew rate control on the final logic gate. Slew rate control is provided by resistors located in the power supply path for the gate. A switch is connected in parallel across the resistor, and can be used to short the resistor to disable or reduce slew rate limiting. The switch is connected to another location within the output circuitry, and disables or reduces the slew rate limiting resistor during a portion of the switching cycle. This provides for slew rate limiting during a portion of switching when it is most needed, and disables it when slew rate limiting is not required.

18 Claims, 2 Drawing Sheets

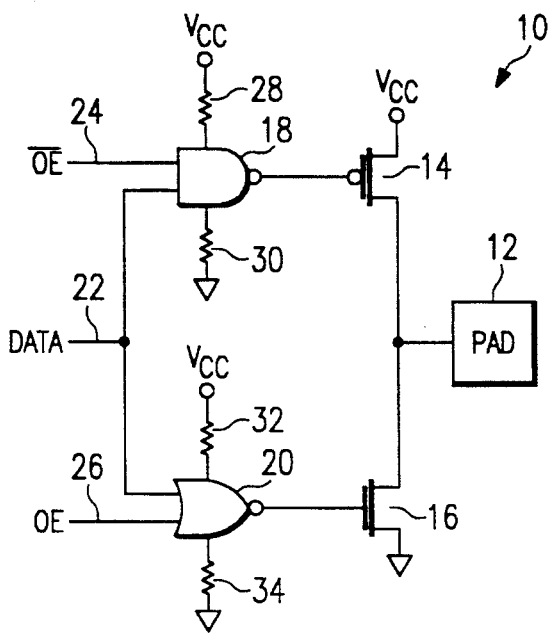
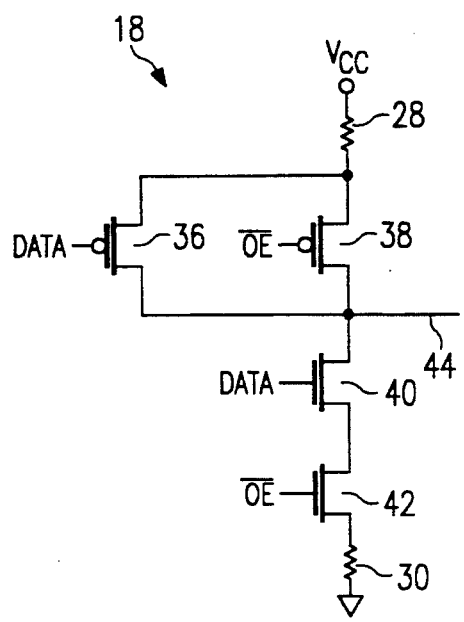
FIG. 1
(PRIOR ART)
FIG. 1A
(PRIOR ART)
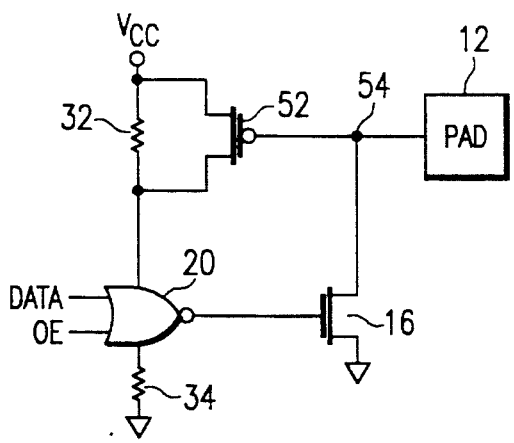
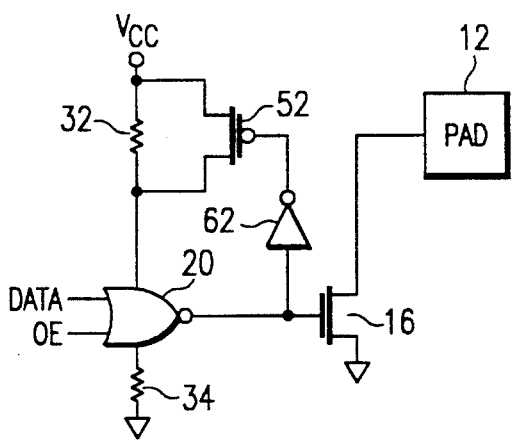
FIG. 2
FIG. 3

SLEW RATE LIMITED OUTPUT BUFFER WITH BYPASS CIRCUITRY

BACKGROUND OF THE INVENTION

1. Field of the Invention

The present invention relates generally to semiconductor integrated circuits, and more specifically to an output driver circuit suitable for use with high speed devices.

2. Description of the Prior Art

As integrated circuits become faster, various factors become important to their operation which are not important at slower speeds. For example, in CMOS integrated circuits, an output circuit connected to the output pad of a chip typically includes one P-channel device and one N-channel device stacked in series. When such output changes state very quickly, current changes occur which have a very steep slope. The rate of change of current, referred to as di/dt, combines with inductance of the output pin and the power supply connected to the output driver to cause a voltage jump which reflects into the power supply. This voltage jump is often referred to as ground bounce.

Since the voltage jump is defined by L(di/dt), it is known that limiting the slope of the output current can help minimize the problem. In order to limit the rate of change of the output current, it is known to limit the switching speed of the output transistors. This is often done by causing the last stage of the output circuitry, which drives the gates of the output transistors, to switch more slowly than usual. This causes the output transistors to turn on and off more slowly, lowering di/dt, and limiting the voltage jump. Even though the changing of state of the output circuit is slowed down, overall speed of the device may actually increase because a long settling time is not needed to recover from the ground bounce phenomenon.

This switching speed limitation of the logic stages driving the output transistors is sometimes referred to as slew rate control.

One technique for controlling the slew rate of the output stage is to place resistors in the supply path to the final stage of logic gates. These resistors cause the logic gates to change state more slowly, which slows the rate of change of voltage to the gate of the output transistors. Thus, as described above, the output transistors change state more slowly, limiting di/dt.

One drawback to this approach, however, is that the use of the limiting resistors tends to slow down the output circuitry more than desired. The value of these resistors must be chosen to decrease the steepest part of the slope of the output from the last logic stage, which requires fairly large resistors. However, this also slows down operation of the final logic stage for portions of the output curve where di/dt limiting is not really required.

It would be desirable to provide an output driver circuit which limits di/dt to sufficiently low values, while providing a circuit which otherwise has maximum speed. It would be further desirable for such a circuit to be formed without adding undue complexity to the output driver portion of the device.

SUMMARY OF THE INVENTION

Therefore, according to the present invention, an output driver stage for an integrated circuit device includes slew rate control on the final logic gate. Slew rate control is provided by resistors located in the power supply path for the gate. A switch is connected in parallel across the resistor, and can be used to short the resistor to disable or reduce slew rate limiting. The switch is connected to another location within the output circuitry, and disables or reduces the slew rate limiting resistor during a portion of the switching cycle. This provides for slew rate limiting during a portion of switching when it is most needed, and disables it when slew rate limiting is not required.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 1 is a schematic diagram of an output driver circuit according to the prior art;

FIG. 1A is a schematic diagram of a single logic gate used with the driver circuit of FIG. 1;

FIGS. 2 and 3 are schematic diagrams of alternative embodiments of portions of output circuit drivers in accordance with the present invention;

DESCRIPTION OF THE PREFERRED EMBODIMENT

Figure 4:
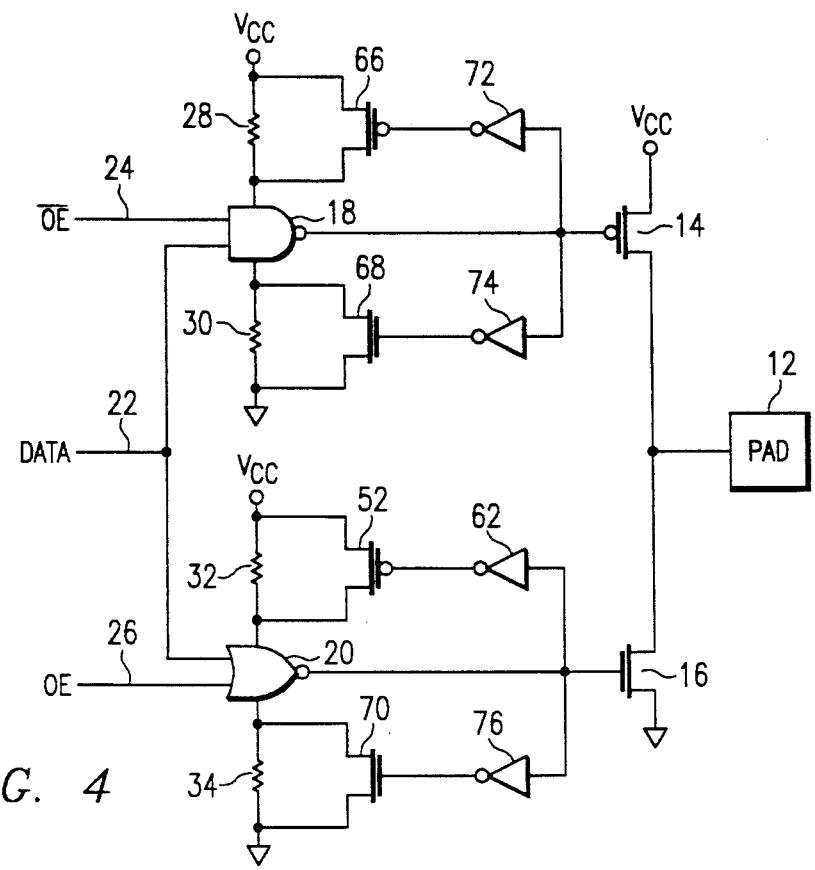
FIG. 4 is a schematic diagram of a complete output driver in accordance with the present invention.

FIG. 1 illustrates an output driver circuit according to the prior art. A bond pad is driven by P-channel and N-channel transistors 14, 16. As is known in the art, the bond pad can be connected, either directly or through a bonding wire, to a lead which projects externally of the packaged integrated circuit device. The output value on the bond pad is determined by the states of transistors 14, 16.

Transistors 14, 16 are operated in complementary states, so that at least one transistor is always off. Thus, for example, when P-channel transistor 14 is on, N-channel transistor 16 is turned off. This causes the supply voltage Vcc to be connected to the output pad 12. When transistor 16 is on and transistor 14 is off, output pad 12 is grounded.

Transistors 14, 16 are driven, respectively, by the outputs of logic gates 18 and 20. Gate 18 is a NAND gate and gate 20 NOR gate. Each logic gate 18, 20 has an input connected to a DATA signal line 22. NAND gate 18 has a second input connected to a complementary output enable signal OE-bar 24. NOR gate 20 has a second input connected to the true output enable signal OE 26.

When OE is high, both of the output transistors 14, 16 are turned off, completely disconnecting the output pad 12 from either power supply terminal.

Resistors 28, 30, 32, 34 are connected between the power supply terminals and each of the logic gates 18, 20. These resistors are used to provide slew rate control for the logic gates 18, 20, limiting output di/dt as known in the art. The values of the various resistors 28-34 may be different, depending upon the amount of slew rate limiting required for both positive and negative going transitions of each output transistor 14, 16.

FIG. 1A shows the details of NAND gate NAND gate 18 includes two P-channel transistors 36, 38 connected in parallel. It also includes two N-channel transistors 40, 42 connected in series. The output of NAND gate 18 is made available at node 44.

When NAND gate 18 is generating a logical 0 (low) output, both of the N-channel transistors 40, 42 are on and both P-channel transistors 36, 38 are off. When the NAND gate 18 changes state, one Of the N-channel transistors 40, 42 turns off, while the corresponding P-channel transistor 36 or 38 turns on. The output node 44 is brought from ground to Vcc at a rate which is determined by the value of resistor 28. For larger values of resistor 2 the rate at which the output node 44 is driven to Vcc is less. Since at least one of the N-channel transistors 40, 42 is turned off during this transition, resistor 30 has little or no impact upon an output transition from logical 0 to logical 1 (low to high).

In an analogous manner, when the output of gate 18 goes from high to low, resistor 30 becomes the primary limiting element determining how quickly the output 44 is brought to ground. Since both P-channel transistors 36 and 38 are turned off, resistor 28 has little or no influence on the rate of change of the output at node 44 during a negative going transition. Depending upon the capacitive loading of node 44, the actual values of the supply voltage Vcc, and other factors commonly dealt with by the designer, the values of resistors 28 and 30 are chosen to limit the rate of change of the voltage at the output node 44 to the desired slope. Operation of NOR gate 20 takes place in a completely analogous manner.

Since the output voltages from the logic gates 18, 20 change relatively slowly, the output transistors 14, 16 also switch states relatively slowly. This, in turn, minimizes the rate of change of current through these transistors, providing the di/dt limiting necessary to minimize voltage jump effects as described above.

Figure 5:
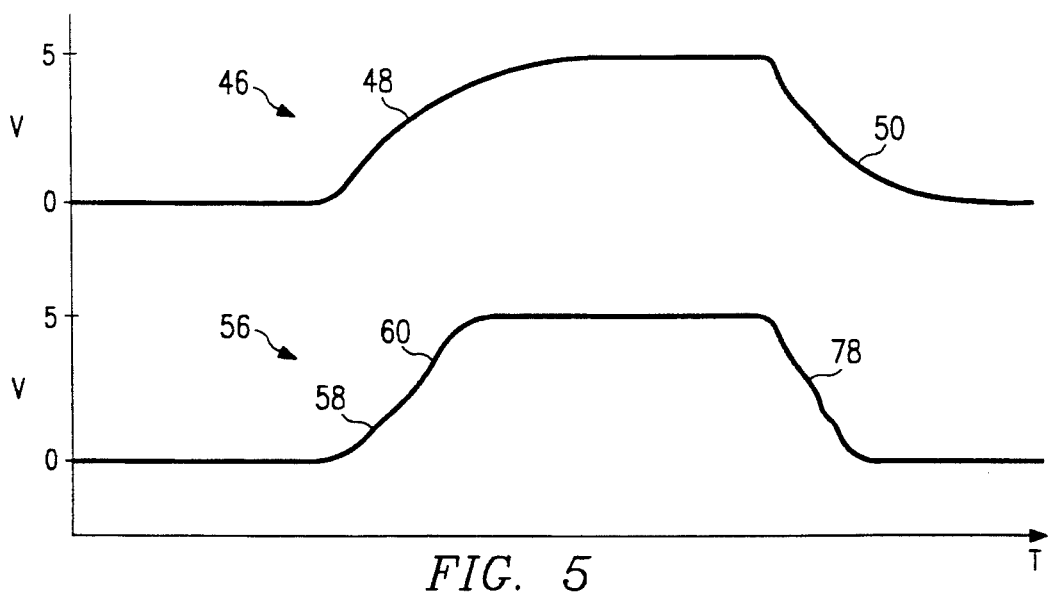
FIG. 5 is a graph illustrating waveforms obtained in output circuits according to the prior art and according to the present invention.

Referring to FIG. 5, upper curve 46 illustrates transitional states at the output of either one of the logic gates 18, 20. A rising portion 48 of the curve 46 illustrates the effect of the limiting resistor placed between the Vcc terminal of the power supply and the gate. Since the load driven by the gate is generally capacitive, an exponential curve characteristic of RC circuits is evident. The steepest part of the curve is near the beginning of the transition, with a gradual flattening of the curve being evident as shown in FIG. 5. The limiting resistor limits the slope of the rising portion 48, at the beginning of the rise, to the maximum value desired. Later on in the rising portion 48, the exponential nature of the curve causes it to flatten out. At this time, the limiting effect of the resistor slows the rate at which the logic gate reaches the positive supply value. Thus, in order to limit the slope of the voltage applied to the output transistor, the overall operating speed of the circuit must be slowed down beyond what would be desirable. During a falling portion of the curve 50, the same type of exponential curve is evident, against slowing the rate at which the output of the logic gate reaches its final value.

A portion of an improved output driver circuit is illustrated in FIG. 2. Portions of the driver circuit which are the same as the circuit 10 shown in FIG. 1 are numbered using the same reference numbers. A P-channel transistor 52 is connected in parallel across resistor 32. The gate of transistor 52 is connected to a node 54 which is connected to the output pad 12. When NOR gate 20 is providing a low output, N-channel output transistor 16 is turned off. P-channel transistor 14 (not shown in FIG. 2) is presumed on, so that the voltage at node 54 is high. This causes P-channel transistor 52 to be turned off, so that resistor 32 operates in a manner described above.

As the output from NOR gate 20 begins to switch from low to high, the voltage at node 54 will start to be pulled to ground. After the voltage of node 54 has been pulled part way to ground, P-channel transistor 52 begins to turn on, and is turned completely on by the time the voltage at node 54 nears ground. This cuts resistor 32 out of the series path between the supply voltage Vcc and the NOR gate 20. As the resistor is cut out of the circuit, the limiting effect of resistor 32 is removed. Thus, the slope of the output voltage from the gate 20 is limited during the first part of the transition, but not during the latter portion of the positive going transition. This gives rise to a voltage applied to the gate of transistor 16 corresponding to the lower curve 56 of FIG. 5.

During a first part 58 of the rising portion of the curve, the slope is limited by resistor 32 as was the case in the prior art. However, during a second part 60 of the rising portion, resistor 32 has been switched out of the circuit and no longer provides a limiting effect. This means that the exponential flattening of the output voltage is removed, allowing it to more quickly reach the high voltage level. The limiting effect of the resistor is not as important in the later portion of the transition.

Since the voltage on the output pad 12 may not be Well controlled, due to its connection to the external world, FIG. 3 illustrates an alternative embodiment to the circuit of FIG. 2. Instead of connecting the gate of transistor 52 to the output voltage, it is instead driven by the output of inverter 62. As before, when the output of NOR gate 20 is low, the gate of transistor 52 is driven high by inverter 62. As the output of NOR gate 20 rises, as shown in the curves of FIG. 5, the trip point of inverter 62 will eventually be reached. As the output of NOR gate 20 passes through the trip point of inverter 62, it switches state and drives the gate of transistor 52 to ground. This turns on P-channel transistor 52, switching resistor 32 out of the circuit. Thus, the output of NOR gate 20 is slew rate limited only during the first portion of the positive going cycle in the same manner as described in connection with FIG. 2.

Referring to FIG. 4, a complete output circuit 64 is shown utilizing the embodiment of FIG. 3. This embodiment includes P-channel transistors 66, 52 connected across resistors 28, 32. It also includes N-channel transistors 68, 70 connected across resistors 30, 34. The various transistors are driven by inverters 72, 74, 62 and 76. If desired, a single inverter could be used to drive both transistors used for slew rate limiting for a single logic gate.

Transistor 66 and inverter 72 function in the same manner as described in connection with FIG. 3 to limit the first portion of a rising transition of the output of NAND gate 18. N-channel transistors 68, 70 driven by inverter 74, 76, are used to remove the slew rate limiting effect of transistors 30 and 34 during falling transitions of the outputs of logic gates 18, 20. When the output of logic gate 18 is high, the output of inverter 74 is low. This turns transistor 68 off. As the output of NAND gate 18 starts to fall, inverter 74 will switch as the output passes through its trip point. This will turn transistor 68 on, cutting resistor 30 out of the path to power supply ground. As described above in connection with FIG. 1A, the effect of resistor 30 is dominant during positive to negative going transitions. Inverter 76 and transistor 70 operate on the NOR gate 20 in the same manner.

The effect of switching out the current limiting transistors to ground for the gates 18, 20 is to provide a falling output portion 78 of the lower curve as shown in FIG. 5. As before, during the first part of the falling portion 78, the current limiting resistor is in place and limits the slope to the desired value. During later parts of the falling portion 78, the limiting resistor is switched out of the circuit, and the output of the logic gate more quickly reaches ground.

The output circuit of FIG. 4 shows switching elements provided for both of the current limiting resistors provided for both of the logic gates 18, 20. However, different implementations may use different ones of these feedback circuits in order to remove current limiting during different portions of rising and falling cycles. For example, in a particular device design, current limiting may be important only for transitions in one direction. Other designs might require switchable slew rate limiting on only one of the output transistors 14, 16, while the other can be limited using prior art techniques. Thus, FIG. 4 shows four feedback paths for switching the slew rate limiting resistors out of the circuit, but any subset of these four may be used in a particular implementation.

Various alternatives will become apparent to those skilled in the art. For example, the switches in parallel with the limiting resistors can be formed using technologies other than CMOS. If desired, two series resistors can be used in place of a single resistor described above, with only one of the two being shorted by a parallel transistor. This would be done to control the slope of the gate output in the later portions of a transition, as well as during the earlier portion.

The techniques described above are suitable for use with different technologies. A CMOS implementation has been described which uses complementary transistors to drive the output pad. However, similar designs use N-channel transistors for both output transistors, and the present invention can be used with such circuits. Also, NMOS devices and bipolar devices can use the described techniques with modifications suitable for their respective technologies.

Using the techniques described above, slew rate limiting can be used for a portion of a transition, and switched out for the remainder. This provides for slew rate limiting as in the prior art, but minimizes the impact of the limiting resistors on the overall speed of the circuit. Thus, it is possible to provide sufficient slew rate limiting to minimize ground bounce and similar effects, while minimizing the adverse speed impacts of the limiting resistors.

While the invention has been particularly shown and described with reference to a preferred embodiment, it will be understood by those skilled in the art that various changes in form and detail may be made therein without departing from the spirit and scope of the invention.

What is claimed is:

1. An output circuit for an integrated circuit device, comprising:

first and second output transistors connected in series across two terminals of a power supply, and having a common node connected to an output pad;

first and second logic gates connected to, respectively, gates of said first and second output transistors for switching them on and off;

a slew rate control circuit between each of the first and second power supply terminals and each of said first and second logic gates; and feedback means controlled by the outputs of said logic gates for at least partially bypassing at least one of said slew rate control circuits during a selected portion of an output transition of said first and second logic gates.

2. The output circuit of claim 1, wherein said slew rate control circuits comprise resistors.

3. The output circuit of claim 1, wherein said feedback means comprises a transistor switch in parallel with at least one of said slew rate control circuits.

4. The output circuit of claim 3, wherein each transistor switch has a gate connected to an output of one of said first or second logic gates.

5. The output circuit of claim 4, wherein the gates of said transistor switches are connected to the logic outputs through inverters which are controlled by the outputs of said logic gates.

6. The output circuit of claim 1, wherein said slew rate control means comprises:

first and second resistors connected between said first and second logic gates, respectively, and a positive power supply terminal;

third and fourth resistors connected between said first and second logic gates, respectively, and a ground power supply terminal;

and wherein said feedback circuit comprises second and third p-channel transistors in parallel with said first and second resistors, and second and third n-channel transistors connected in parallel with said third and fourth resistors.

7. The output circuit of claim 6, wherein said second and third p-channel and said second and third n-channel transistors have gates connected to the outputs of said logic gates through inverters which are controlled by the outputs of said logic gates.

8. The output circuit of claim 1, wherein said slew rate control circuits comprise resistors, and wherein said feedback means bypasses the resistors during a selected portion of an output transition of said first and second logic gates.

9. The output circuit of claim 1, wherein said first output transistor comprises a p-channel transistor, and said second output transistor comprises an n-channel transistor.

10. An output driver circuit, comprising:

an output transistor connected to an integrated circuit output pad;

a logic gate having an output connected to a gate of said output transistor for turning said output transistor on and off;

slew rate control means connected to said logic gate for controlling its slew rate; and a feedback circuit connected to said slew rate control means and controlled by the output of said logic gate, wherein said feedback circuit bypasses said slew rate control means during a selected portion of an output transition of said logic gate.

11. The output circuit of claim 10, wherein said feedback circuit comprises a transistor switch in parallel with an element of said slew rate control means.

12. The output circuit of claim 11, wherein said slew rate control means comprises a resistor between said logic gate and a power supply terminal.

13. The output circuit of claim 11, wherein said feedback circuit comprises an inverter which is controlled by the output of said logic gate.

14. The output driver of claim 10, further comprising:
a second slew rate control means connected between a second supply terminal and said logic gate; and
a second feedback circuit connected to said second slew rate control means, wherein said second feedback circuit disables at least a portion of said second slew rat control means during a selected portion of an output transition of said logic gate.

15. The output driver of claim 14, wherein said first and second slew rate control means each comprise a resistor.

16. The output driver of claim 15, wherein said first and second feedback circuits comprise a switch connected in parallel with the slew rate control resistors.

17. The output driver of claim 16, wherein said switches have gates connected to the output of said logic gate through a feedback circuit.

18. The output driver of claim 17, wherein said feedback circuit comprises an inverter which is controlled by the output of said logic gate.

* * * * *